(12) United States Patent
Shibazaki et al.

(10) Patent No.: US 8,023,103 B2
(45) Date of Patent: Sep. 20, 2011

(54) EXPOSURE APPARATUS, EXPOSURE METHOD, AND METHOD FOR PRODUCING DEVICE

(75) Inventors: Yuichi Shibazaki, Kumagaya (JP); Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 969 days.

(21) Appl. No.: 11/712,957

(22) Filed: Mar. 2, 2007

(65) Prior Publication Data

US 2007/0242249 A1 Oct. 18, 2007

Related U.S. Application Data

(60) Provisional application No. 60/851,044, filed on Oct. 12, 2006.

(30) Foreign Application Priority Data

Mar. 3, 2006 (JP) .................................. 2006-058739

(51) Int. Cl.
G03B 27/42 (2006.01)
(52) U.S. Cl. ................................ 355/53; 355/67; 355/30
(58) Field of Classification Search .................... 355/30, 355/53, 67
See application file for complete search history.

(56) References Cited

U.S. PATENT DOCUMENTS

| | | | |
|---|---|---|---|
| 6,383,940 B1 * | 5/2002 | Yoshimura | 438/708 |
| 6,819,405 B2 | 11/2004 | Mulkens et al. | |
| 2002/0005495 A1 * | 1/2002 | Kohno | 250/492.2 |
| 2005/0248741 A1 * | 11/2005 | Kawamura et al. | 355/53 |
| 2007/0013890 A1 | 1/2007 | Loopstra et al. | |

FOREIGN PATENT DOCUMENTS

| | | |
|---|---|---|
| JP | A-11-111601 | 4/1999 |
| JP | A 11-111601 | 4/1999 |
| JP | A 2000-021742 | 1/2000 |
| JP | A-2000-21751 | 1/2000 |
| JP | A 2001-297976 | 10/2001 |
| WO | WO 02/069049 A2 | 9/2002 |

OTHER PUBLICATIONS

May 22, 2007 International Search Report for International Patent Application No. PCT/JP2007/054012 (with translation).
May 22, 2007 International Preliminary Report on Patentability for International Patent Application No. PCT/JP2007/054012 (with translation).

* cited by examiner

*Primary Examiner* — Edward Glick
*Assistant Examiner* — Mesfin T Asfaw
(74) *Attorney, Agent, or Firm* — Oliff & Berridge, PLC

(57) ABSTRACT

The present invention provides an exposure method which illuminates each of patterns, to be subjected to double exposure, on entire surfaces thereof in optimal illumination conditions respectively, and which performs the exposure with high throughput. Upon transferring a pattern of a reticle onto a wafer by the scanning exposure method, first and second pattern areas are formed in advance on the reticle to be adjacent in the scanning direction, and when the first and second pattern areas simultaneously pass across a field of a projection optical system, the first pattern area is illuminated in a first illumination condition by using a first illumination slit of which width in the scanning direction is gradually narrowed, and the second pattern area is illuminated in a second illumination condition by using a second illumination slit of which width in the scanning direction is gradually widened, to thereby expose the wafer.

46 Claims, 7 Drawing Sheets

EXPOSURE APPARATUS, EXPOSURE METHOD, AND METHOD FOR PRODUCING DEVICE

REFERENCE TO RELATED APPLICATION

The present application claims priority from Japanese Patent Application No. 2006-058739 filed on Mar. 3, 2006 and U.S. Provisional Patent Application No. 60/851,044 filed on Oct. 12, 2006, the disclosures of which are incorporated herein by reference in their entirety.

BACKGROUND OF THE INVENTION

1. Field of the Invention

The present invention relates to an exposure technique for transferring a pattern onto a substrate such as a wafer in the lithography process for producing various devices such as a semiconductor device, a liquid crystal display device, or a thin-film magnetic head, and in particular, the present invention is preferably used for multiple exposure, for example, double exposure of a substrate.

2. Description of the Related Art

The double exposure method is one of the exposure methods used for transferring a pattern of a reticle as a mask onto a wafer (or glass plate or the like) coated with a resist to produce a semiconductor device or the like. In this method, for example, in the case that a pattern, in which a periodic pattern and an isolated pattern are present in a mixed manner, is exposed onto a same layer on a wafer, the reticle pattern is split (divided) into a first pattern corresponding to the periodic pattern and a second pattern corresponding to the isolated pattern, and these two patterns are successively double-exposed by optimizing an exposure condition, thereby obtaining high imaging performance. Conventionally, when the exposure is performed by using such a double exposure method, a first exposure is performed by using a first reticle on which at least one piece of the first pattern is formed, and then the first reticle is exchanged with a second reticle on which at least one piece of the second pattern is formed and the second exposure is performed. However, when the exposure is performed by exchanging the reticles in this manner, any high throughput cannot be obtained.

Therefore, there is proposed an exposure method in which first and second patterns are formed in advance on one reticle, the first and second patterns of the reticle are transferred onto first and second shot areas adjacent on a wafer respectively, and then the wafer is step-moved in the scanning direction by a distance corresponding to one shot area and the first and second patterns of the reticle are transferred on the second and third shot areas on the wafer, thereby double-exposing the first and second patterns onto the second shot area (see, for example, Japanese Patent Application Laid-open No. 11-111601). In this exposure method, by changing the illumination condition between the first and second patterns at the time of scanning exposure, the illumination condition can be optimized with respect to the two patterns.

SUMMARY OF THE INVENTION

In the above-described double exposure method combined with conventional scanning exposure, when only the first or second pattern is within an illumination area in which the illumination condition is variable, the illumination condition can be optimized for one of the first and second patterns. However, when the two patterns are simultaneously within the illumination area, it is difficult to set illumination conditions individually for the patterns respectively. Therefore, it is difficult to optimize the illumination condition for each of the first and second patterns on each of the entire surface of the first and second patterns.

In addition, when the illumination conditions of the two patterns are greatly different from each other, a certain amount of time is required to switch the illumination condition by an illumination optical system. Therefore, it is difficult to increase the scanning velocity for the reticle (and consequently for the wafer as well), and there arises another problem that it is difficult to further increase the throughput.

The present invention was made in view of these circumstances, and a first object of the present invention is to provide an exposure technique which is capable of illuminating the entire surfaces of two patterns (pattern areas), which are arranged close to each other, in optimal illumination conditions therefor respectively when the two patterns are transferred onto a substrate by the scanning exposure method.

Further, a second object of the present invention is to provide an exposure technique and an exposure method for producing a device which are capable performing the double exposure with a high throughput, and are capable of performing the exposure in an optimal illumination condition on the entire surface of each of the patterns (pattern areas) to be double-exposed.

According to a first aspect of the present invention, there is provided an exposure method in which an exposure light beam is irradiated onto the substrate via a mask and a projection optical system while moving the substrate in synchronization with movement of the mask in a predetermined scanning direction, the method comprising: a first step for moving a mask in the scanning direction, the mask having first and second pattern areas previously formed thereon to be adjacent in the scanning direction, and illuminating the first pattern area in a first illumination condition by using a first illumination area of which width in the scanning direction is variable, when the first pattern area passes across a field of the projection optical system, to expose the substrate; a second step for illuminating the first pattern area in the first illumination condition by using the first illumination area of which width in the scanning direction is gradually narrowed and illuminating the second pattern area in a second illumination condition by using a second illumination area of which width in the scanning direction is gradually widened, when the first and second pattern areas simultaneously pass across the field, to expose the substrate; and a third step for illuminating the second pattern area in the second illumination condition by using the second illumination area of which width in the scanning direction is variable, when the second pattern area passes across the field, to expose the substrate.

The present invention further includes, as an example, a fourth step for step-moving the substrate, by a distance corresponding to the width of the second pattern area, in a direction corresponding to the scanning direction, and executing operations of the first to third steps to double-expose a block area, of the substrate, exposed with a pattern image of the second pattern area, with a pattern image of the first pattern area.

According to the exposure method of the first aspect of the present invention, by switchingly using the first and second illumination areas, the entire surfaces of the first and second pattern areas can be illuminated in optimal illumination conditions, respectively. Further, when the method has the fourth step, the double exposure can be performed with a high throughput by the scanning exposure method, without exchanging the masks.

According to a second aspect of the present invention, there is provided an exposure method for exposing a substrate with an exposure light beam via a projection optical system, the method comprising: independently setting illumination conditions in first and second illumination areas onto which the exposure light beam is to be irradiated; and moving first and second patterns, which are arranged in a predetermined scanning direction, with respect to the first and second illumination areas while moving, in synchronization with the movement of the first and second patterns, the substrate with respect to a first exposure area onto which the exposure light beam is to be irradiated via the first pattern and the projection optical system and with respect to a second exposure area onto which the exposure light beam is to be irradiated via the second pattern and the projection optical system; and scanning-exposing different block areas, on the substrate, which are located at different positions in the scanning direction.

According to a third aspect of the present invention, there is provides an exposure apparatus which moves a substrate synchronously with movement of a mask in a predetermined scanning direction while irradiating an exposure light beam onto the substrate via the mask and a projection optical system, the apparatus comprising: an illumination optical system which illuminates a first illumination area, of which width in the scanning direction is variable in a field of the projection optical system, in a first illumination condition, and which illuminates a second illumination area, of which width in the scanning direction in the field is variable, in a second illumination condition; and an illumination controller which controls the width in the scanning direction of the first illumination area and the width in the scanning direction of the second illumination area based on a position of the mask in the scanning direction.

According to the exposure apparatus of the third aspect of the present invention, the exposure method of the first aspect of the present invention can be used. Further, when the exposure apparatus further has a field coupling system (field combining system), the first and second illumination areas can be illuminated in different illumination conditions respectively with a simple construction.

In the present invention, as an example, the illumination optical system has: a first partial illumination system which illuminates an area conjugate to the first illumination area in the first illumination condition; a second partial illumination system which illuminates an area conjugate to the second illumination area in the second illumination condition; and a field coupling system which couples exposure light beams from the first and second partial illumination systems to illuminate the mask.

According to a fourth aspect of the present invention, there is provided an exposure apparatus which exposes a substrate with an exposure light beam via a projection optical system, the exposure apparatus comprising: an illumination optical system which irradiates the exposure light beam onto first and second illumination areas and which sets illumination conditions in the first and second illumination areas independently from each other; and a controller which moves first and second patterns, arranged in a predetermined scanning direction, with respect to the first and second illumination areas while moving, in synchronization with the movement of the first and second patterns, the substrate with respect to a first exposure area onto which the exposure light beam is to be irradiated via the first pattern and the projection optical system and with respect to a second exposure area onto which the exposure light beam is to be irradiated via the second pattern and the projection optical system, and which scanning-exposes different block areas on the substrate located at different positions in the scanning direction.

According to a fifth aspect of the present invention, there is provided a method for producing a device, using the exposure method or exposure apparatus of the present invention.

PREFERRED EMBODIMENT FOR CARRYING OUT THE INVENTION

In the following, an example of a preferred embodiment of the present invention will be described with reference to the drawings. In this example, the present invention is applied to perform the double exposure by using a scanning exposure type exposure apparatus of the step-and-scan system.

Figure 1:
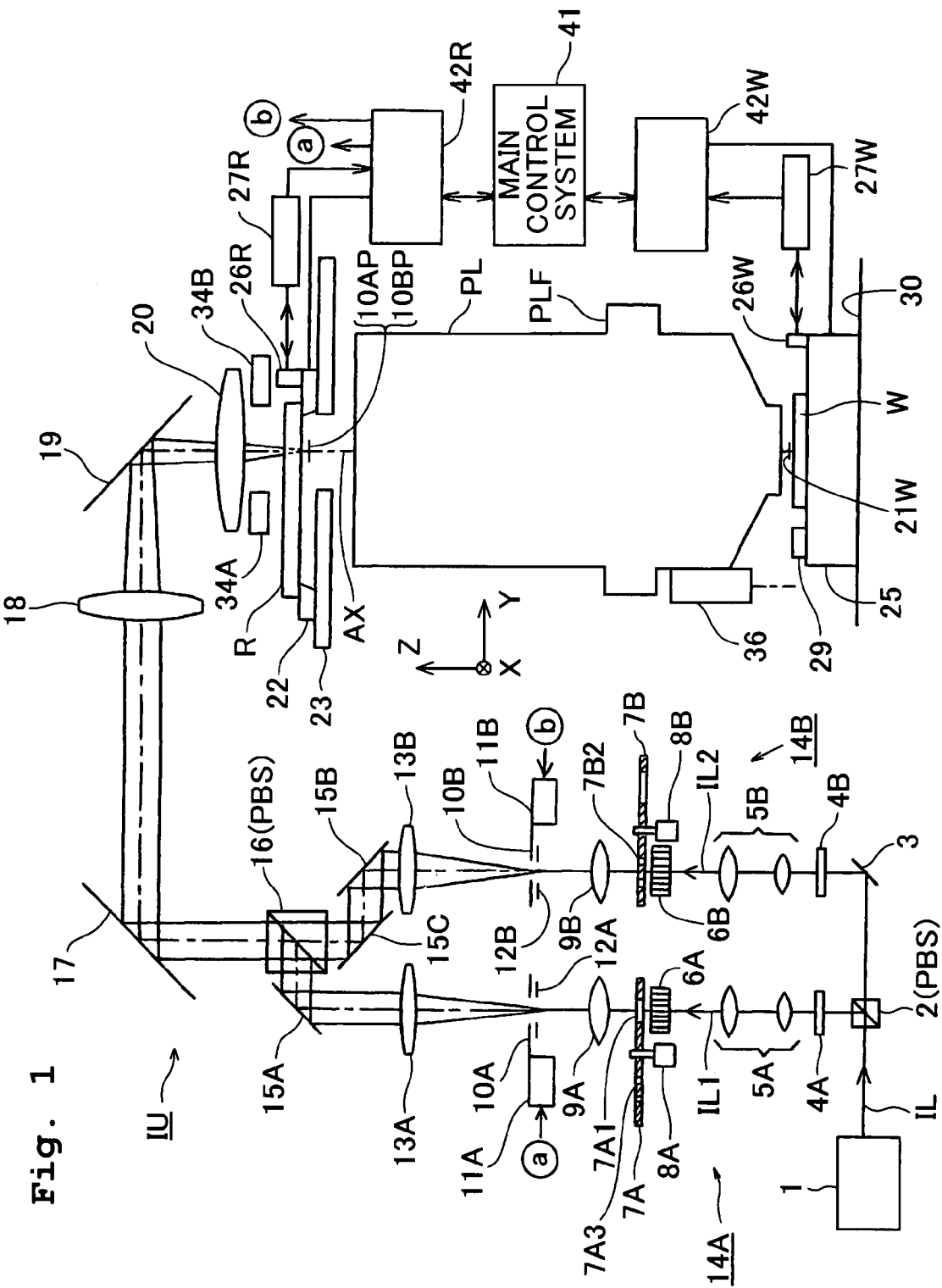
FIG. 1 is a drawing showing a general construction of an exposure apparatus used in an example of an embodiment of the present invention.

FIG. 1 shows an exposure apparatus of this example. In FIG. 1, the exposure apparatus includes an exposure light source 1; an illumination optical system IU which illuminates a reticle R as the mask with an exposure light (exposure light beam) from the exposure light source 1; a reticle stage 22 which moves while holding the reticle R; a projection optical system PL which projects an image of a pattern in an illumination area on the reticle R onto a wafer W as the substrate on which a resist (photosensitive material) is coated; a wafer stage 25 which moves while holding the wafer W; a drive mechanism for these stages; and a main control system 41 constructed of a computer which integrally controls the entire operations of these drive mechanisms, etc. Although an ArF excimer laser beam (wavelength: 193 nm) is used as the exposure light source 1, a high-harmonic wave generator such as a KrF excimer laser (wavelength: 248 nm), an $F_2$ laser beam (wavelength: 157 nm), and a solid laser beam (YAG laser or semiconductor laser, etc.) or a mercury lamp or the like are also usable as the exposure light source.

The exposure light beam IL formed of a linear polarized ultraviolet pulse laser beam emitted from the exposure light source 1 comes into the illumination optical system IU via an unillustrated beam matching unit (BMU) or the like, and is split into a first exposure light beam IL1 and a second exposure light beam IL2 by an optical splitter 2, and these split light beams come into a first illumination unit 14A and a second illumination unit 14B, respectively. In this example, a polarization beam splitter (PBS) is used as the optical splitter 2, and the polarization direction of the exposure light beam IL coming into the optical splitter 2 is set so that the light amount (S-polarized component) of the first exposure light beam IL1 to be reflected by the optical splitter 2 and the light amount (P-polarized component) of the second exposure light beam IL2 transmitted through the optical splitter 2 become equal to each other. Note that as the optical splitter 2, for example, a half mirror can also be used.

The first exposure light IL1 which comes into the first illumination unit 14A comes into an optical integrator 6A via a polarization control element 4A controlling a polarization state, a light amount control member (not shown), and a shaping optical system 5A making a light amount distribution (or intensity distribution) of the first exposure light beam IL1 on a predetermined plane conjugate to the pupil plane of the projection optical system PL, namely, on the pupil plane of the illumination optical system IU. When the optical splitter 2 is a polarization beam splitter, it is sufficient that the polarization control element 4A transmits the incoming light as it is. When the optical splitter 2 is a half mirror, the polarization control element 4A is constructed of an optical element (½ wavelength plate or the like) for setting the polarization direction (or polarization distribution) of the first exposure light beam IL1 to a desired state.

The shaping optical system 5A is constructed to include, as an example, a diffractive optical element (DOE), a zoom lens system, and a pair of prisms (axicon or the like) at least one of which is movable. In this example, although a fly-eye lens is used as the optical integrator 6A, an inner-surface reflective integrator (rod integrator or the like) or a diffractive optical element, etc., may be used instead. Further, for the purpose of further improving the uniformity of the illuminance distribution of the exposure light beam, it is also allowable to use a plurality of optical integrators which are joined together via a relay optical system.

On the light-exit surface of the optical integrator 6A, an aperture stop plate 7A is arranged rotatably; and around the rotation axis of the aperture stop plate 7A, for example, a circular aperture stop 7A1 for normal illumination, an aperture stop for bipolar illumination for the X-axis constructed of two eccentric small apertures, an aperture stop 7A3 for bipolar illumination for the Y-axis having a shape rotated by 90 degrees with respect to the aperture stop for bipolar illumination for the X-axis, an annular aperture stop for annular illumination, a small circular aperture stop for small coherence factor (σ value), and the like are arranged. The main control system 41 rotates the aperture stop plate 7A via a drive motor 8A to set a desired aperture stop of the aperture stops on the light-exit surface of the optical integrator 6A to thereby make it possible to set a light amount distribution of the first exposure light beam IL1 on the pupil plane of the illumination optical system IU, namely an illumination condition in the first illumination slit 10AP (described later) on the reticle R by the first exposure light beam IL1. In this example, the shaping optical system 5A are used together with the aperture stop plate 7A to thereby make the illumination condition to be variable while suppressing the light amount loss due to the aperture stop. However, it is allowable that the illumination condition is made variable by providing only one of the shaping optical system 5A and the aperture stop plate 7A. When the illumination condition is changed only by the shaping optical system 5A, without providing the aperture stop plate 7A, then the movement and/or exchange of the optical element of the shaping optical system 5A, for example, exchange of the diffractive optical element and movement of the zoom lens system or the prisms are performed. Further, it is also possible that the polarization state of the first exposure light beam IL1 at the first illumination slit 10AP on the reticle R is made to be variable by, for example, the polarization control element 4A. Note that the constructions of the polarization control element 4A and the shaping optical system 5A are disclosed in, for example, United States Patent Application Publication No. 2006/0170901 etc.

A part of the first exposure light beam IL1 which passed through the aperture stop arranged on the light-exit surface of the optical integrator 6A is split (branched) and comes into an integrator sensor (not shown) constructed of a photoelectric detector, and a light amount of the split part of the first exposure light beam IL1 is measured, and from the result of this measurement, an integrated exposure amount at each point on the wafer W is indirectly detected. The substantial part of the first exposure light beam IL1 passes through the first relay lens 9A and comes into a blind device (masking system) which defines an illumination area on the reticle R. In this example, this blind device includes a fixed reticle blind (fixed field stop) 12A and a movable reticle blind (movable field stop) 10A which makes the width of the illumination area to be variable at least with respect to the scanning direction (Y direction in this example), as disclosed in, for example, U.S. Pat. No. 5,473,410, etc. The fixed reticle blind 12A and the movable reticle blind 10A are arranged closely to each other on a plane substantially conjugate to a pattern surface, of the reticle R, as an object to be transferred (transfer-objective). The fixed reticle blind 12A is a field diaphragm which defines the shape of an illumination area having a slit-shape elongated in the non-scanning direction (X direction in this example) (and defines the maximum width in the scanning direction of the illumination area) on the reticle R; and the movable reticle blind 10A is driven by a drive mechanism 11A so as to prevent the first exposure light beam IL from being irradiated onto an area which is different from a desired pattern area on the reticle R at the time of scanning exposure. The operation of the drive mechanism 11A is controlled by a reticle stage drive system 42R which will be described later. The movable reticle blind 10A is used also for controlling the width in the non-scanning direction of the illumination area. Namely, the width of the illumination area in the non-scanning direction is set in accordance with the width of the pattern area on the reticle R.

In this example, as will be described later, an illumination area set by the blind device (10A, 12A) of the first illumination unit 14A and an illumination area set by the blind device (10B, 12B) of the second illumination unit 14B are field-coupled or combined on the pattern surface of the reticle R (namely, the object plane of the projection optical system PL). Therefore, hereinafter, the illumination area defined on the reticle R by the first illumination unit 14A is referred to as "first illumination slit 10AP", and the illumination area defined on the reticle R by the second illumination unit 14B is referred to as "second illumination slit 10BP". In a state that the movable reticle blinds 10A and 10B are fully opened, the widths of the first illumination slit 10AP and the second illumination slit 10BP of this example become maximum values defined by the fixed reticle blinds 12A and 12B respectively, and the first and second illumination slits 10AP and 10BP become a same area in the field of the projection optical system PL.

The first exposure light beam IL which passed through the fixed reticle blind 12A and the movable reticle blind 10A is bent substantially at a right angle via a second relay lens 13A and an optical path-bending mirror 15A, and then comes into a field coupling device 16. The first illumination unit 14A is constructed to include the above-descried optical members from the polarization control element 4A to the second relay lens 13A. When the optical splitter 2 is a polarization beam splitter, the field coupling device 16 is also a polarization beam splitter, and the first exposure light beam IL comes into the field coupling device 16 in an S-polarized state and is reflected by the field coupling device 16. However, for example, when the polarization illumination controlling the polarization state of the first exposure light beam IL1 is used, a half mirror may be used as the field coupling device 16, although the light amount is reduced in this case.

On the other hand, the second exposure light beam IL2 which comes into the second illumination unit 14B is reflected by the mirror 3 and then comes into a second relay lens 13B via a polarization control element 4B, a light amount control member (not shown), a shaping optical system 5B, an optical integrator 6B, an aperture stop plate 7B (driven by a drive motor 8B), a split-optical system (not shown) for integrator sensor, a first relay lens 9B, a fixed reticle blind 12B, and a movable reticle blind 10B (driven by a drive mechanism 11B controlled by the reticle stage drive system 42R) which are constructed similar to the optical members of the first illumination unit 14A, respectively. The second illumination unit 14B is constructed to include the optical members from the polarization control element 4B to the second relay lens 13B. The second exposure light beam IL2 which passed through the second relay lens 13B comes into the field coupling device 16 via optical path-bending mirrors 15B and 15C in a state that the optical axis of the second exposure light beam IL2 is shifted in parallel. When the field coupling device 16 is a polarization beam splitter, the second exposure light beam IL2 comes into the field coupling device 16 in a P-polarized state and is transmitted through the field coupling device 16 as it is. When the field coupling device 16 is a half mirror, the polarization state of the second exposure light beam IL2 can also be controlled into a desired state.

As a result, the first exposure light beam IL1 and the second exposure light beam IL2 exiting from the field coupling device 16 are coupled coaxially. In this example, although the first illumination unit 14A and the second illumination unit 14B have the same construction, the movable reticle blinds 10A and 10B are driven independently from each other. Therefore, the shapes and/or sizes (widths) of the first illumination slit 10AP as the illumination area of the first exposure light beam IL1 and the second illumination slit 10BP as the illumination area of the second exposure light beam IL2 can be set independently from each other by the blind devices 12A and 10A of the first illumination unit 14A and by the blind devices 12B and 10B of the second illumination unit 14B, respectively.

Further, the aperture stop plates 7A and 7B are also driven independently. Therefore, the illumination condition in the first illumination slit 10AP set by the first illumination unit 14A and the illumination condition in the second illumination slit 10BP set by the second illumination unit 14B can be set independently from each other. Note that in this example, the shaping optical systems 5A and 5B can also be driven independently from each other. The light amount distributions of the first and second exposure light beams IL1 and IL2 coming into the aperture stops set on the light-exit surfaces of the integrators 6A and 6B respectively are adjusted individually by the shaping optical systems 5A and 5B respectively, thereby making it to suppress the light amount losses due to the aperture stops.

The exposure light beams IL1 and IL2 coupled by the field coupling device 16 passes via a mirror 17 which bends the optical path horizontally, a first condenser lens 18, a mirror 19 which bends the optical path substantially vertically downwardly, and a second condenser lens 20, and illuminates, with a uniform illuminance distribution, the illumination slits 10AP and 10BP in the pattern area provided on a pattern surface (lower surface) of the reticle R. A field coupling optical system is constructed to include the mirrors 15A to 15C, the field coupling device 16, the mirrors 17 and 19, and condenser lenses 18 and 20; and the illumination optical system IU is constructed to include this field coupling optical system, the first illumination unit 14A, and the second illumination unit 14B. In this example, the exposure light beams IL1 and IL2 are irradiated onto first and second exposure areas on the wafer W respectively via the reticle R and the projection optical system PL. However, the first and second exposure areas are in conjugate relationship to the first and second illumination slits 10AP and 10BP respectively with respect to the projection optical system PL. Therefore, when the widths in the scanning direction of the first and second illumination slits 10AP and 10BP are maximized, the first and second exposure areas become a same area, namely completely overlap each other in the field on the side of the image plane of the projection optical system PL. Accordingly, in the following description, the first and second exposure areas will be collectively referred to as "exposure area 21W". Further, when the widths in the scanning direction of the first and second illumination slits 10AP and 10BP are changed, then the widths in the scanning direction of the first and second exposure areas are also changed as well. Therefore, in the following, explanation for the changes in widths or the like of the first and second exposure areas on the wafer at the time of scanning exposure will be omitted.

Irradiated by the exposure light beams IL1 and IL2, the patterns in the illumination slits 10AP and 10BP of the reticle R are projected onto the exposure area 21W on the wafer W, on which a resist is coated, at a predetermined projection magnification $\beta$ ($\beta$ is $\frac{1}{4}$, $\frac{1}{5}$ or the like) via the projection optical system PL. The wafer W is a disc-shaped substrate having a diameter of, for example, 200 mm, 300 mm or the like. The projection optical system PL is supported to an unillustrated column by a flange PLF. For example, as disclosed in International Publication No. 2006/038952 etc., the projection optical system PL may be hung with respect to an unillustrated main frame or a reticle base 23 arranged at a position over or above the projection optical system PL. A dioptric system may be used as the projection optical system PL. Alternatively, as the projection optical system PL, a catadioptric projection optical system or the like may also be used which includes an optical system having an optical axis from the reticle toward the wafer and a catadioptric optical system having an optical axis substantially orthogonal to the optical axis of the optical system, and which forms an intermediate image twice inside thereof, as disclosed, for example, in Japanese Patent Application Laid-open No. 2001-249286.

The projection optical system PL of this example is a dioptric system in which an effective field on the side of its object plane is a circular area with optical axis AX being the center thereof, and areas in which the illumination slits 10AP and 10BP are maximized are each a rectangular area elongated in the X direction which is substantially inscribed in the circular area (contour of the effective field) about the optical axis AX. Here, a common area, in which the illumination slits 10AP and 10BP are maximized, is referred to as the illumination field (illumination field on the side of the object plane) of the projection optical system PL. Similarly, the first and second exposure areas in which the widths in the scanning direction become maximum are each a rectangular area elongated in the X direction which is substantially inscribed in the circular field about the optical axis AX on the side of the image plane of the projection optical system PL; and this area is referred to as the exposure field (exposure field on the side of the image plane) of the projection optical system PL. In the following, an explanation will be given about a case in which a Z axis is set, in parallel to the optical axis AX of the projection optical system PL; a Y axis is set, in a plane perpendicular to the Z axis, along the scanning direction (direction parallel to the sheet surface of FIG. 1) of the reticle R and the wafer W at the time of scanning exposure; and an X axis is set along the non-scanning direction (direction perpendicular to the paper surface of FIG. 1) which is perpendicular to the scanning direction.

First, the reticle R is attracted and held on the reticle stage 22, and the reticle stage 22 is placed on the reticle base 23 so as to be continuously movable in the Y direction by, for example, a linear motor. Further, in the reticle stage 22, a mechanism for finely moving the reticle R in the X direction, the Y direction, and a rotation direction about the Z axis is also incorporated. The position of the reticle stage 22 (reticle R) is measured highly accurately by a moving mirror 26R on the reticle stage 22 (or may be measured by a reflecting surface formed on the stage) and a laser interferometer 27R arranged opposite to or facing the moving mirror 26R; and based on the result of this measurement and on control information from the main control system 41, the reticle stage drive system 42R controls the operation of the reticle stage 22. Also, the reticle stage drive system 42R controls the opening and closing operations of the movable reticle blinds 10A and 10B via the drive mechanisms 11A and 11B, namely controls the widths in the Y direction of the first illumination slit 10AP and the second illumination slit 10BP based on the position information of the reticle stage 22 (consequently, of the reticle R) in the Y direction (scanning direction).

The opening and closing operations of the movable reticle blinds 10A and 10B may be controlled by a controller which is provided independently from the reticle stage drive system 42R.

On the other hand, the wafer W is attracted and held on the wafer stage 25 via a wafer holder (not shown). The wafer stage 25 is constructed of a Z tilt stage which controls a focus position (position in the Z direction) and a tilt angle (rotations around the X axis and Y axis) of the wafer W; and an XY stage which is continuously moved in the Y direction on the wafer base 30 by, for example, a linear motor, and which step-moves in the X direction and the Y direction. The position of the wafer stage 25 (wafer W) is measured highly accurately by the moving mirror 26W on the wafer stage 25 (or may be measured by a reflecting surface formed on the stage) and the laser interferometer 27W arranged opposite to or facing the moving mirror 26W; and based on the result of this measurement and on control information from the main control system 41, the wafer stage drive system 42W controls the operation of the wafer stage 25.

At the time of normal scanning exposure, in synchronization with the movement of the reticle R in the Y direction at a velocity VR with respect to the illumination slit 10AP and/or 10BP via the reticle stage 22, the wafer W is moved in the Y direction at a velocity β·VR (β represents the projection magnification from the reticle R to the wafer W) with respect to the exposure area 21W via the wafer stage 25, to thereby successively transfer images of the patterns in successive two pattern areas (described in detail later) of the reticle R onto two shot areas on the wafer W respectively, the two shot areas being adjacent to each other on the wafer W in the scanning direction. Note that in this example, since the projection optical system PL performs inverted projection, the scanning directions of the reticle R and the wafer W are opposite to each other. However, when the projection optical system PL projects an erecting image in the scanning direction, the scanning directions of the reticle R and the wafer W are same. Afterwards, the operations for step-moving the wafer stage 25 to move the next shot area on the wafer to the scanning start position and for perform scanning exposure are repeated in a step-and-scan manner, thereby performing exposure successively for two shot areas on the wafer adjacent to each other in the scanning direction, respectively.

When this exposure is an overlay exposure, the reticle R and the wafer W are required to be aligned in advance. Therefore, a reference mark member 29 on which a reference mark is formed is fixed in the vicinity of the wafer on the wafer stage 25, and an alignment sensor 36 based on image processing system, for detecting the position of an alignment mark provided to each of the shot areas on the wafer W, is arranged on a side surface of the projection optical system PL. Further, a pair of alignment systems 34A and 34B based on image processing system, for measuring the position of an alignment mark on the reticle R, is arranged at a position over or above the reticle stage 22. In practice, the alignment systems 34A and 34B are arranged at a position over or above the both ends in the X direction (non-scanning direction) of the illumination slits 10AP and 10BP. The results of detections by the alignment sensor 36 and the alignment systems 34A and 34B are processed by an unillustrated alignment control system.

In the following, an example of the operation of the double exposure in this example will be described. On a pattern surface of the reticle R in this example, two pattern areas (patterns to be transferred) for the double exposure are formed along the scanning direction.

Figure 2:
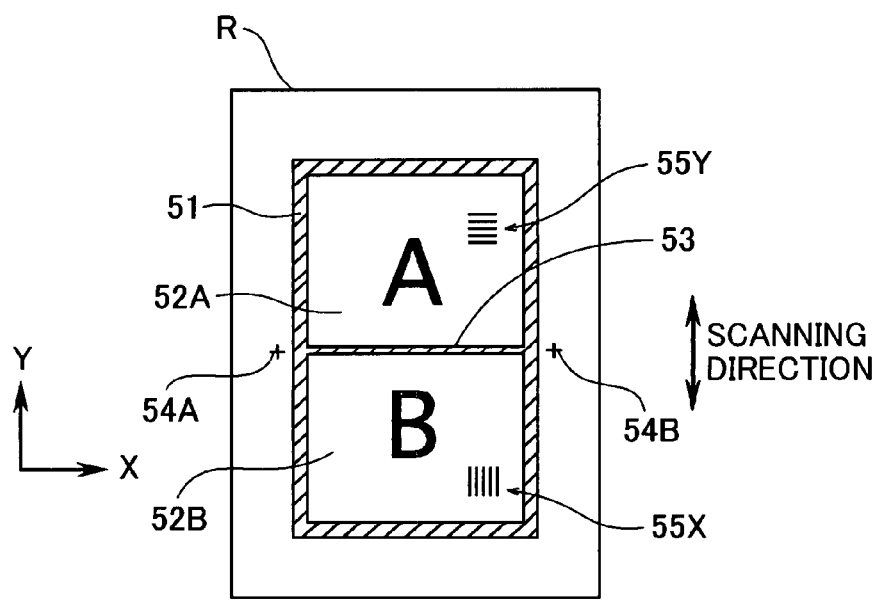
FIG. 2 is a plan view showing a pattern arrangement of a reticle used in the embodiment.

FIG. 2 is a plan view showing a pattern arrangement of the reticle R used in this example. In FIG. 2, a rectangular area surrounded by a light-shielding zone 51 in the reticle R is divided into two first and second pattern areas 52A and 52B which have a same size in the Y direction, and mutually different transfer patterns (hereinafter referred to as pattern A and pattern B, respectively) are drawn in the pattern areas 52A and 52B, respectively. The patterns A and B are patterns formed of a circuit pattern to be transferred onto one layer of each of the shot areas on the wafer W, and by performing the exposure while the images of the patterns A and B are overlaid, a projection image corresponding to the circuit pattern is exposed onto each of the shot areas. As an example, the pattern A in the first pattern area 52A is formed of a Y-direction line-and-space pattern (hereinafter referred to as L&S pattern) 55Y arranged in the Y direction at pitches substantially corresponding to a resolution limit, and the pattern B in the second pattern area 52B is formed of an X-direction L&S pattern 55X arranged in the X direction at pitches substantially corresponding to the resolution limit.

In this example, the pattern A in the first pattern area 52A and the pattern B in the second pattern area 52B are transferred onto each of the shot areas on the wafer W by the first illumination slit 10AP and the second illumination slit 10BP of FIG. 1, respectively. Therefore, to increase the resolution, in the first illumination unit 14A, an aperture stop 7A3 for bipolar illumination which forms two secondary light sources apart in the Y direction is selected so as to set an illumination condition optimal for the Y-direction L&S pattern 55Y, namely so as to set bipolar illumination for the Y axis. On the other hand, in the second illumination unit 14B, the aperture stop 7B2 for bipolar illumination is selected which forms two secondary light sources apart in the X direction so as to set an illumination condition optimal for the X-direction L&S pattern 55X, namely so as to set bipolar illumination for the X axis. In this case, the illumination slits 10AP and 10BP are illuminated by bipolar illumination orthogonal to each other, respectively. Note that, in a case, for example, that the pattern A is formed of a periodic pattern and the pattern B is formed of an isolated pattern, as an example, the illumination condition of the first illumination slit 10AP may be annular illumination, and the illumination condition of the second illumination slit 10BP may be a small-σ illumination or the like. When the field coupling device 16 of FIG. 1 is a half mirror, it is also possible that the polarization illumination is optimized for at least one of the patterns A and B.

Each of the pattern areas 52A and 52B of the reticle R of FIG. 2 has a size corresponding to that of one shot area on the wafer W, and the light-shielding zone 53 as the boundary between the pattern areas 52A and 52B has a width corresponding to that of a street line (scribe line) which serves as the boundary between adjacent shot areas on the wafer W. That is, images of the two pattern areas 52A and 52B reduced at the projection magnification of the projection optical system PL correspond to the sizes of two shot areas adjacent to each other on the wafer W in the scanning direction. Provided that the width of the street line on the wafer W is 100 µm and the magnification of the projection optical system PL is ¼, then the width of the light-shielding zone 53 is 400 µm. With the width of this extent, even when there is a slight positional error at the edges of the movable reticle blinds 10A and 10B of FIG. 1, it is possible to prevent the first illumination slit 10AP (or the second illumination slit 10BP) from being illuminated onto the inside of the second pattern area 52B (or the first pattern area 52A). Further, provided that the maximum width of the exposure area (width of the exposure field) on the wafer W is, for example, 6 mm, and the magnification of the projection optical system PL is ¼, then the maximum width (width of the illumination field) of the illumination slit on the reticle R is 24 mm. Therefore, the spacing distance between the patterns A and B (width of the light-shielding zone 53) and the spacing distance between two shot areas (width of street line) are set greatly narrower as compared with the maximum width of the illumination slit and the maximum width of the exposure area.

A pair of alignment marks 54A and 54B are formed so as to sandwich the pattern areas of the reticle R in the X direction, and the positions of these alignment marks 54A and 54B are measured by the alignment systems 34A and 34B of FIG. 1, thereby making it possible to align the reticle R.

Figure 4:
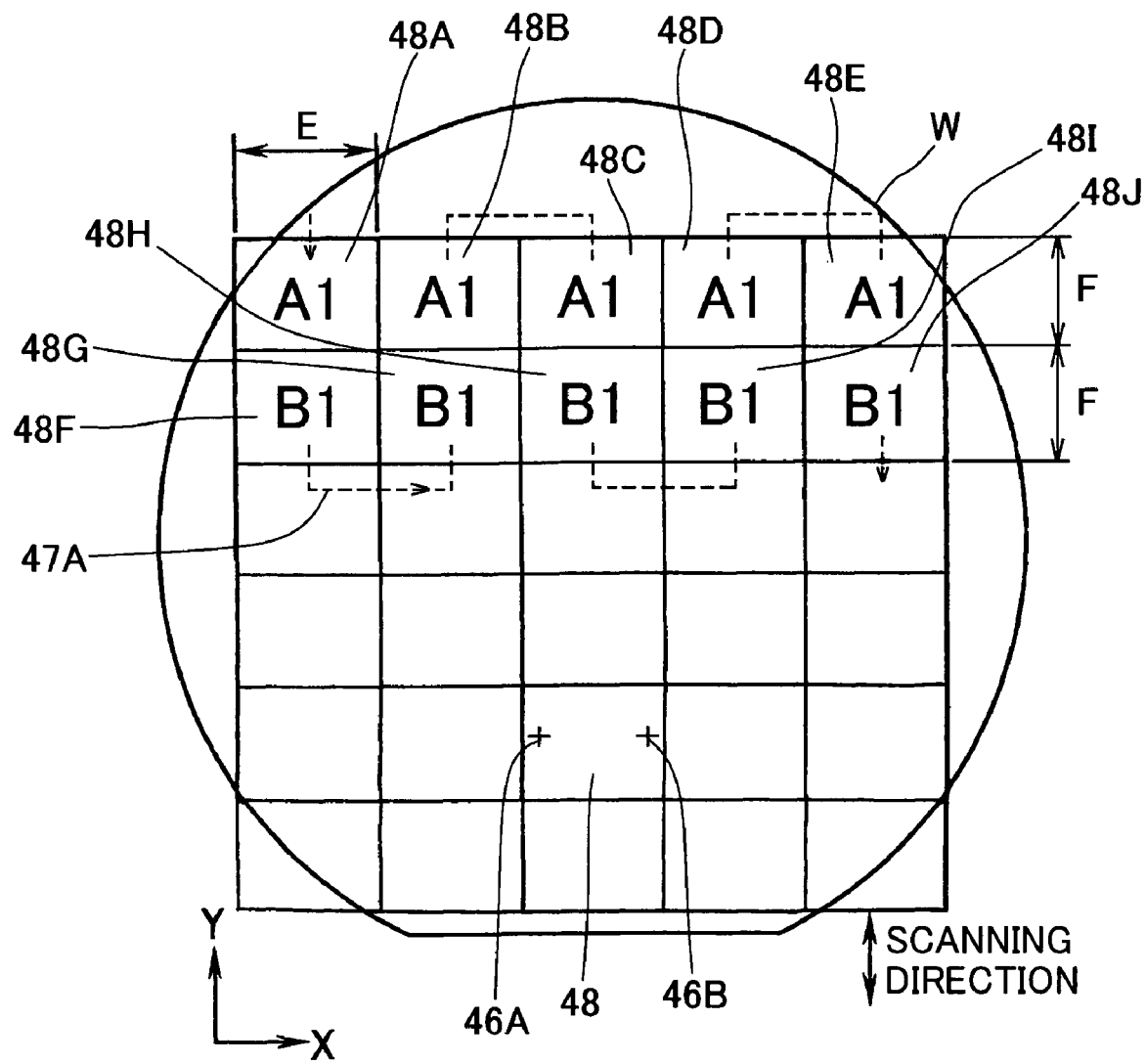
FIG. 4 is a plan view showing an example of arrangement of shots on a wafer in the embodiment.

FIG. 4 shows a shot arrangement on the wafer W of this example. In FIG. 4, a large number of shot areas (shown as a shot area 48 representatively) are formed on the wafer W at a predetermined pitch in the X direction and Y direction, and these shot areas 48 are rectangular areas each of which has a width F in the Y direction (scanning direction) and a width E in the X direction including an area up to the center of the street line at the boundary with another shot area adjacent thereto. Each of these shot areas 48 is double-exposed with the image of the pattern A in the first pattern area 52A and the image of the pattern B in the second pattern area 52B of the reticle R shown in FIG. 2. Further, for example, two alignment marks 46A and 46B are provided to each of the shot areas 48, and coordinates (positions) of the alignment marks 46A and 46B in a predetermined number of shot areas 48 selected on the wafer W are measured by the alignment sensor 36 of FIG. 1. Then, the measured values are statistically processed according to the enhanced global alignment method disclosed in, for example, U.S. Pat. No. 4,780,617, thereby making it possible to determine the position of each of the shot areas on the wafer W to perform the alignment.

Next, an explanation will be given about an operation for double-exposing the shot areas 48, which are arranged as shown in FIG. 4 on the wafer W, with images of the patterns A and B in the two pattern areas 52A and 52B of the reticle R of FIG. 2. In this example, the projection optical system PL performs the inverted projection. However, for the convenience of the explanation, it is assumed that the patterns A and B of the reticle R of FIG. 2 are projected as erecting images on the two shot areas 48 mutually adjacent in the scanning direction on the wafer W.

<First Step>

Figure 3A:
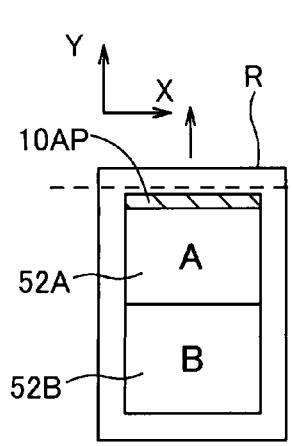
FIGS. 3A to 3H are views explaining a switching operation for two illumination slits 10AP and 10BP on the reticle R at the time of scanning exposure.
Figure 3B:
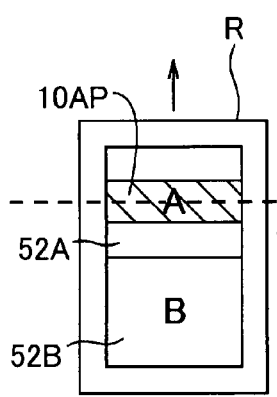

First, two shot areas 48A and 48F adjacent to each other in the Y direction on the wafer W of FIG. 4 are exposed by one time of scanning with an image A1 of the pattern A in the pattern area 52A and an image B1 of the pattern B in the pattern area 52B of the reticle R of FIG. 2, respectively. For this purpose, as shown in FIG. 3A, scanning of the reticle R in the +Y direction with respect to the illumination field of the projection optical system PL is started, and in accordance with the movement of the pattern area 52A of the reticle R, the width in the scanning direction of the first illumination slit 10AP in the illumination field is gradually widened (becomes gradually wider). In synchronization with this, scanning of the wafer W in the −Y direction with respect to the exposure field of the projection optical system PL is started, and in accordance with the movement of the shot area 48A on the wafer W, the width in the scanning direction of the first exposure area in the exposure field is gradually widened (becomes gradually wider). At this time, the wafer W is driven synchronously so that shot areas 48A and 48F on the wafer W are overlapped with the images of the pattern areas 52A and 52B on the reticle R, respectively. Then, as shown in FIG. 3B, in a state that only the first pattern area 52A of the reticle R is in the illumination field of the projection optical system PL, the width in the scanning direction of the first illumination slit 10AP is maximized. With this, the image A1 of the pattern in the first pattern area 52A is successively exposed onto the shot area 48A of the wafer W shown in FIG. 4.

<Second Step>

Figure 3C:
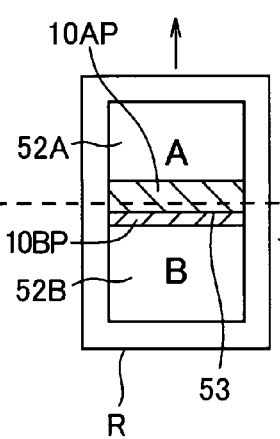

Next, as shown in FIG. 3C, when the second pattern area 52B also enters the illumination field of the projection optical system PL in addition to the first pattern area 52A of the reticle R, then, with the light-shielding zone 53 of the reticle R being as a reference, in the illumination field in the +Y direction, the first pattern area 52A is illuminated by the first illumination slit 10AP, and in the illumination field in the −Y direction than the light-shielding zone 53, the second pattern area 52B is illuminated by the second illumination slit 10BP. At this time, the width in the scanning direction of the first illumination slit 10AP is gradually narrowed, and the width in the scanning direction of the second illumination slit 10BP is gradually widened, and the exposure of the image B1, of the pattern in the second pattern area 52B of the reticle R, onto the shot area 48F on the wafer W of FIG. 4 is started.

Figure 3D:
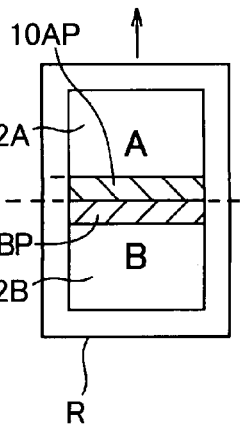
Figure 3E:
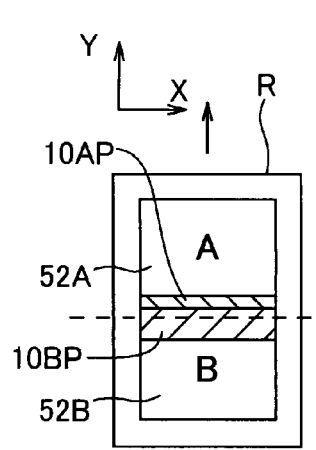

Then, as the reticle R is scanned in the +Y direction, the widths in the scanning direction of the two illumination slits 10AP and 10BP become equal to each other as shown in FIG. 3D; and then, the width of the first illumination slit 10AP is gradually narrowed as shown in FIG. 3E, and when the width reaches to zero, the exposure of the image A1 onto the shot area 48A of FIG. 4 is ended.

<Third Step>

Figure 3F:
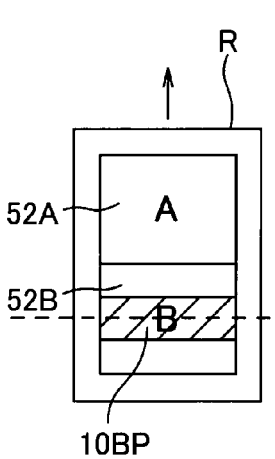
Figure 3G:
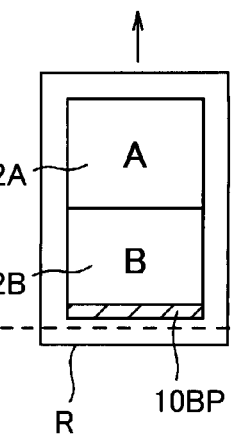

Next, as shown in FIG. 3F, in a state that only the second pattern area 52B of the reticle R is in the illumination field of the projection optical system PL, the width in the scanning direction of the second illumination slit 10BP is maximized, and the image B1 of the pattern in the second pattern area 52B is successively exposed onto the shot area 48F on the wafer W of FIG. 4. Thereafter, as shown in FIG. 3G, the width of the second illumination slit 10BP is gradually narrowed, and at a point of time when the width becomes zero, the exposure of the image B1 onto the shot area 48F of FIG. 4 also is ended.

Figure 3H:
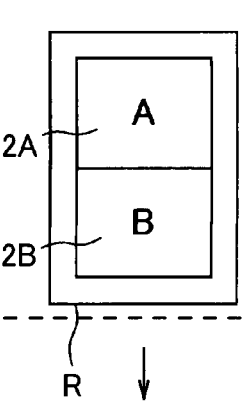

Next, as shown in FIG. 3H, the reticle R is moved to the scanning start position in the +Y direction with respect to the illumination field of the projection optical system PL, and in FIG. 4, the wafer W is step-moved in the X direction by a value (distance) corresponding to the width E in the X direction of one shot area 48, and then in synchronization with movement of the reticle R in the −Y direction, the wafer W is moved in the +Y direction. In this case, the widths in the scanning direction of the illumination slits 10AP and 10BP change in the order of FIG. 3G to FIG. 3A, and the images A1 and B1 of the patterns in the pattern areas 52A and 52B of the reticle R are exposed onto the shot areas 48B and 48G adjacent to each other in the Y direction on the wafer W of FIG. 4, respectively. Thereafter, the wafer stage 25 is driven so that the wafer W and the exposure area 21W relatively move along a locus 47A of FIG. 4, and the reticle R and the wafer W are synchronously moved while the widths of the illumination slits 10AP and 10BP are changed independently as shown in FIG. 3, thereby exposing the image A1 onto the shot areas 48A to 48E in the first row on the wafer W of FIG. 4, and exposing the image B1 onto the shot areas 48F to 48J in the second row.

<Fourth Step>

Figure 5:
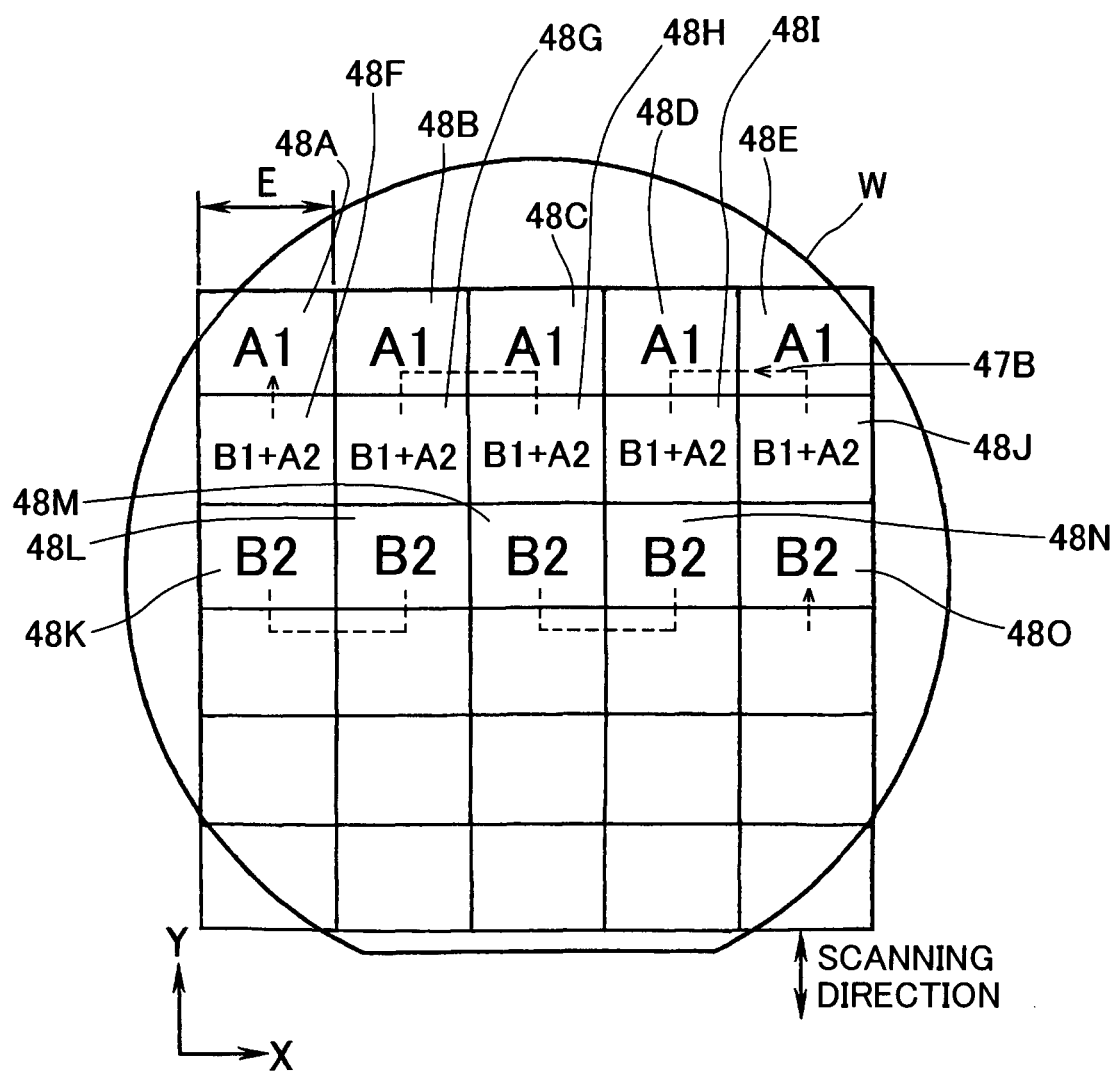
FIG. 5 is a plan view for explaining a case in which exposure is performed for shot areas on the second and third rows on the wafer.

Next, after the wafer W of FIG. 4 is step-moved in the −Y direction by a distance corresponding to the width F in the Y direction of the shot area 48, and then the above-described first to third steps are executed for the shot areas 48J and 48O adjacent to each other in the Y direction on the wafer W of FIG. 5, to thereby expose, by one scanning, the image A2 of the pattern in the first pattern area 52A and the image B2 of the pattern in the second pattern area 52B of the reticle R of FIG. 2 onto the shot areas 48J and 48O, respectively. With this, onto the shot area 48J, the image B1 of the pattern in the second pattern area 52B and the image A2 of the pattern in the first pattern area 52A of the reticle R are double-exposed.

Thereafter, the wafer stage 25 is driven so that the wafer W and the exposure area 21W relatively move along the locus 47B of FIG. 5, and the reticle R and the wafer W are synchronously moved while the widths of the illumination slits 10AP and 10BP are changed independently as shown in FIG. 3, thereby exposing the image A2 onto the shot areas 48J to 48F in the second row on the wafer W of FIG. 5, and exposing the image B2 onto the shot areas 48O to 48K in the third row. Then, the images B1 and A2 are double-exposed onto the shot areas 48F to 48J in the second row.

Figure 6:
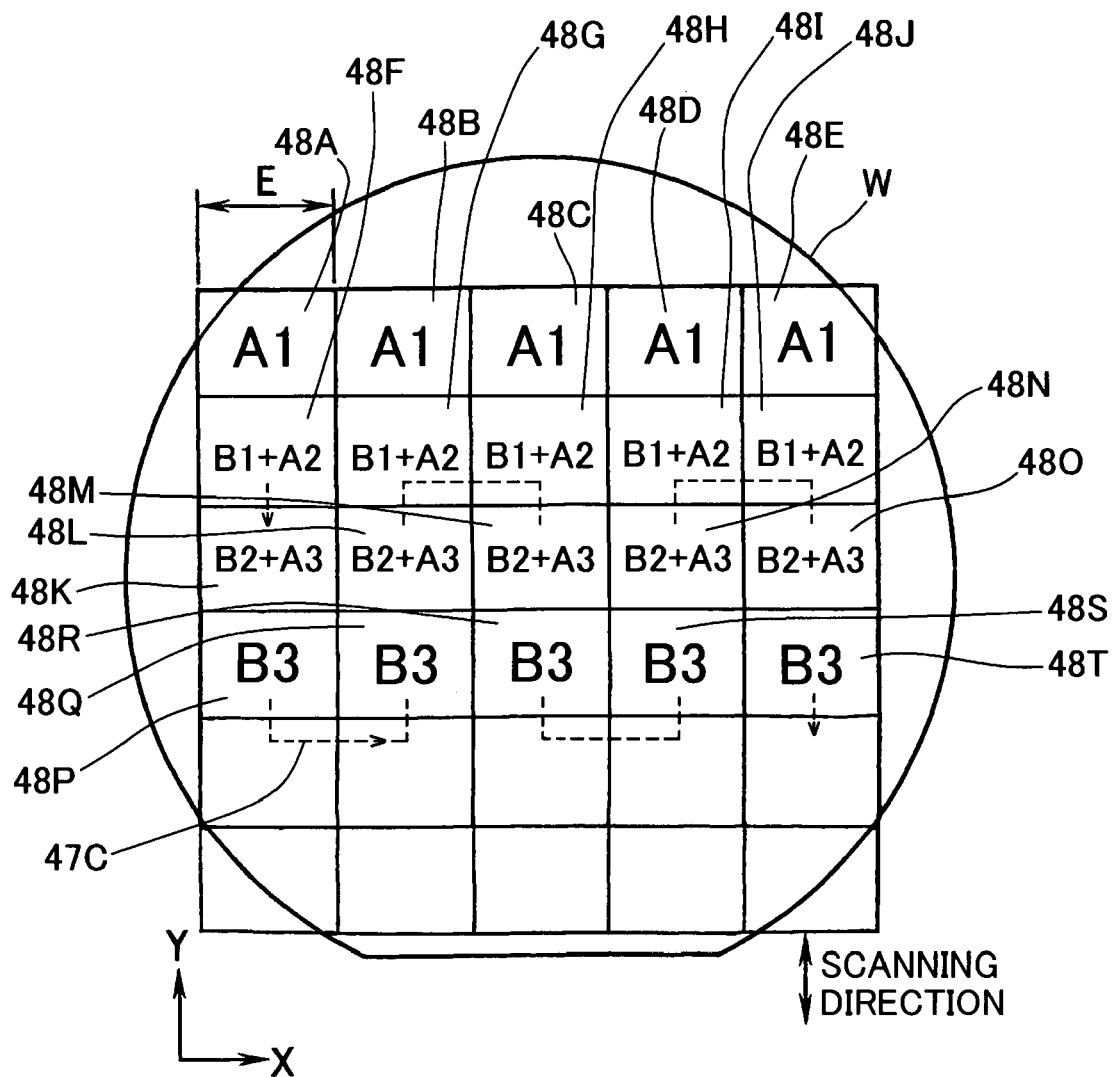
FIG. 6 is a plan view for explaining a case in which exposure is performed for shot areas on the third and fourth rows on the wafer.

Next, after the wafer W of FIG. 5 is step-moved in the −Y direction by a distance corresponding to the width F in the Y direction of the shot area 48 (see FIG. 4), the wafer stage 25 is driven so that the wafer W and the exposure area 21W relatively move along the locus 47C of FIG. 6, and the reticle R and the wafer W are synchronously moved while the widths of the illumination slits 10AP and 10BP are changed independently as shown in FIG. 3, thereby exposing the image A3 of the pattern in the first pattern area 52A of the reticle R onto the shot areas 48K to 48O in the third row on the wafer W of FIG. 6, and exposing the image B3 of the pattern in the second pattern area 52B onto the shot areas 48P to 48T in the fourth row. As a result, the images B2 and A3 are double-exposed onto the shot areas 48K to 48O in the third row.

By repeating these operations, the image of the pattern in the first pattern area 52A and the image of the pattern in the second pattern area 52B of the reticle R are double-exposed onto all shot areas except for the shot areas on the ends in the ±Y directions on the wafer W. At this time, two shot areas mutually adjacent in the scanning direction on the wafer W are exposed by one time of scanning, thereby making it possible to perform the double exposure at an extremely high throughput.

Note that it is necessary to separately expose only the image of the pattern in the pattern area 52A or 52B of the reticle R on the shot areas at the ends in the Y direction on the wafer W. However, in practice, since the number of shot areas on the wafer W is considerably greater than the number of shot areas shown in FIG. 4, the throughput is hardly degraded. Here, it is allowable that the exposure of the image of the pattern in the pattern area 52B with respect to the shot areas 48A to 48E at the end in the +Y direction is performed before performing the above-described exposure operations, and that the exposure of the image of the pattern in the pattern area 52A with respect to the shot areas at the end in the −Y direction is performed after the above-described exposure operations.

In this example, the widths in the scanning direction of the two illumination slits 10AP and 10BP on the reticle R are controlled independently from each other by using the two illumination units 14A and 14B of FIG. 1. Therefore, during the scanning exposure, the entire surfaces of the patterns in the pattern areas 52A and 52B of the reticle R of FIG. 2 can be illuminated in optimized illumination conditions respectively. Accordingly, it is possible to obtain high imaging performance for the projected image for which the double exposure has been performed.

Afterwards, the wafer W is developed to thereby form a resist pattern in each of the shot areas, and etching or the like is performed by using the resist pattern as a mask, thereby forming a target circuit pattern. At this time, since the images of the patterns A and B are exposed in the optimized exposure conditions (including illumination conditions) respectively, the imaging performance (resolution, etc.) of the image of the double-exposed pattern is excellent on the entire surface, and the line-width controllability of the circuit pattern finally formed is also excellent. Therefore, a semiconductor device or the like can be produced highly accurately.

Figure 7:
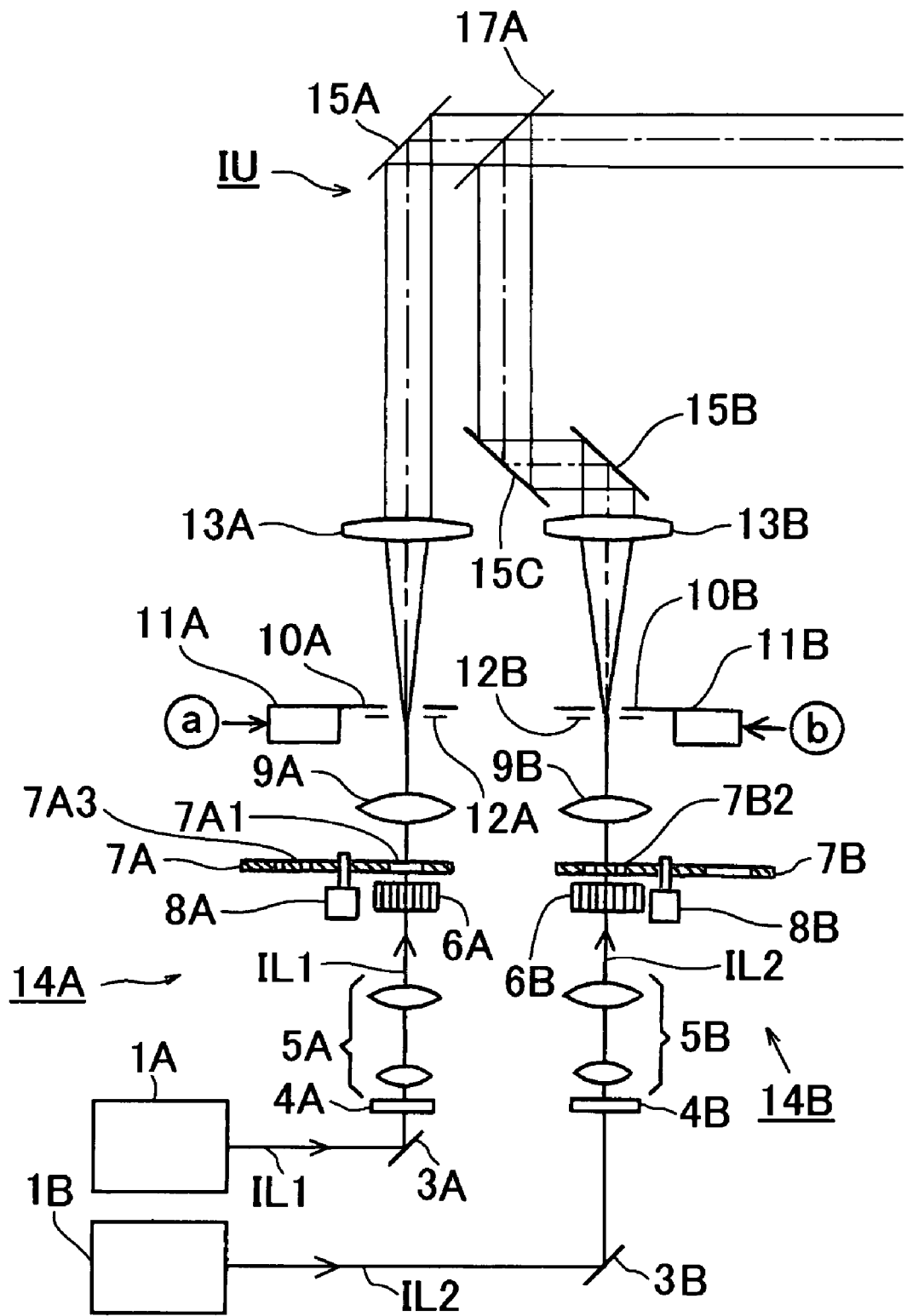
FIG. 7 is a view showing the main portion of an illumination optical system of another example of the embodiment of the present invention.

In the above-described embodiment, although one exposure light source 1 is used as shown in FIG. 1, two exposure light sources 1A and 1B which emit pulse lights independently may also be used as shown in FIG. 7. Further, although two exposure light beams IL1 and IL2 are coupled by the field coupling device 16 at a position before the mirror 17 as shown in FIG. 1, it is also allowable, as shown in FIG. 7, that a polarization beam splitter 17A (or half mirror) is arranged instead of the mirror 17. In FIG. 7, the exposure light beam IL1 from the first exposure light source 1A is guided to the first illumination unit 14A via the mirror 3A, and the exposure light beam IL2 from the second exposure light source 1B is guided to the second illumination unit 14B via the mirror 3B. Further, the exposure light beam IL1 from the second relay lens 13A is guided to the polarization beam splitter 17A via the mirror 15A, and the exposure light beam IL2 from the second relay lens 13B is guided to the polarization beam splitter 17A via the mirrors 15B and 15C, thereby making it possible to couple the two exposure light beams IL1 and IL2 by using the polarization beam splitter 17A as the field coupling device. The coupled light flux is supplied to the first condenser lens 18 of FIG. 1. With this, the construction of the illumination optical system can be simplified. Further, by providing independent exposure light sources corresponding to the illumination units 14A and 14B respectively, it is possible to independently control the spectral widths, central wavelengths, and pulse frequencies, etc., of the exposure light beams IL1 and IL2.

In the above-described embodiment, as shown in FIG. 2, two pattern areas 52A and 52B are formed adjacent to each other on one reticle R. However, it is also allowable that the two pattern areas 52A and 52B are formed on different reticles, and the double exposure is performed while holding the two reticles so as to be separate and away in the scanning direction on the reticle stage 22 of FIG. 1. Further, in the above-described embodiment, each of the shot areas on the wafer is double-exposed with the patterns A and B in the two pattern areas 52A and 52B arranged along the scanning direction. However, it is also allowable that at least three pattern areas are arranged along the scanning direction to perform triple or more multiple exposures. Furthermore, in the above-described embodiment, although the patterns A and B formed on the two pattern areas 52A and 52B are different, the patterns A and B may be same.

The projection optical system in the exposure apparatus of the above-described embodiment has one field on the side of the object plane and one field on the side of the image plane. However, the number of the fields is not limited to this. The projection optical system may have two fields on, for example, the side of the image plane. In this case, since the first and second exposure areas are arranged in each of the two fields on the side of the image plane, it is possible to concurrently perform the double exposure for two wafers by using two wafer stages, thereby further improving the throughput. Moreover, the exposure apparatus of the above-described embodiment is provided with a single projection optical system having a field in which the above-described first and second illumination areas are inscribed therein on the side of the object plane. However, it is also allowable that the exposure apparatus has a plurality of projection optical systems splitting a pattern into a plurality of split-patterns which are to be formed pattern areas respectively to be projected onto a wafer, as disclosed, for example, in U.S. Pat. No. 7,088,425, etc.

The projection optical system in the exposure apparatus of the above-described embodiment is not limited to a reduction system, but may be a ×1 magnification system or a magnifying system; and the projection optical system is not limited to the dioptric system, but may be a catoptric system or a catadioptric system, and its projected image may be an inverted image or an erecting image. Further, the exposure area onto which an exposure light beam is irradiated via the projection optical system is an on-axis area including the optical axis within the field of the projection optical system. However, the exposure area may be, for example, an off-axis area of which exposure area does not include the optical axis, similarly to a so-called inline type catadioptric system in which a plurality of reflecting surfaces are provided; an optical system (catoptric or dioptric system) forming an intermediate image at least once is provided at a part thereof; and in which a single optical axis is provided, as disclosed in International Publication No. 2004/107011. Although the above-described illumination area and exposure area have rectangular shapes, the shape of the illumination and exposure areas are not limiting to this, and may have an arced, trapezoid, parallelogram shape or the like.

In the above-described embodiment, the position information of the reticle stage and the wafer stage are measured by using an interferometer. However, the measurement of the position information is not limited to this, and it is also allowable to use, for example, an encoder system which detects a scale (diffraction grating) provided on the upper surface of, for example, the wafer stage. In this case, it is preferable that a hybrid system is adopted which includes both the interferometer system and the encoder system, and in which the result of measurement by the encoder system is calibrated by using the result of measurement by the interferometer system. Alternatively, the position control of the substrate stage may be performed by switchingly using an interferometer system and an encoder system or by using both of the interferometer and encoder systems.

As a substrate to be exposed (exposure-objective substrate) in the above-described embodiment, without being limited to a semiconductor wafer for producing a semiconductor device, those applicable include a glass substrate for producing a display device, a ceramic wafer for producing a thin-film magnetic head, a master plate (synthetic silica glass, silicon wafer) for the mask or the reticle to be used for the exposure apparatus, a film member, or the like. The shape of the substrate is not limited to the circular shape, and may be rectangular or the like.

The exposure apparatus of the above-described embodiment may include a plurality of wafer stages as disclosed in, for example, Japanese Patent Application Laid-open No. 10-163099 (corresponding to U.S. Pat. No. 6,590,634), Published Japanese Translation of PCT International Publication for Patent Application No. 2000-505958 (corresponding to U.S. Pat. No. 5,969,441), etc. In this exposure apparatus, the exposure operation and the measuring operation (including the alignment operation) can be concurrently performed. Further, the exposure apparatus of the above-described embodiment may include a measurement stage which is movable independently from the wafer stage and which is provided with a measuring member (for example, reference member having a reference mark formed therein and/or various photoelectric sensors), as disclosed in, for example, Japanese Patent Application Laid-open No. 11-135400 (corresponding to International Publication No. 1999/23692) and Japanese Patent Application Laid-open No. 2000-164504 (corresponding to U.S. Pat. No. 6,897,963).

The exposure apparatus of the above-described embodiment is manufactured by assembling various subsystems including the respective constitutive elements as defined in the claims of this application so that the predetermined mechanical accuracy, electric accuracy, and optical accuracy are maintained. In order to secure these accuracies, adjustments performed before and after the assembling include the adjustment for achieving the optical accuracy for the optical systems, the adjustment for achieving the mechanical accuracy for the mechanical systems, and the adjustment for achieving the electric accuracy for the electric systems. The steps of assembling the various subsystems into the exposure apparatus include, for example, the mechanical connection, the wiring connection of the electric circuits, and the piping connection of the air pressure circuits in the various subsystems. It is as a matter of course that the steps of assembling the respective subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. For example, after an unillustrated column mechanism is installed, the illumination optical system and the projection optical system each constructed of a plurality of optical elements are incorporated in the body of the exposure apparatus and then the optical adjustments are performed; the reticle stage and wafer stage including a large number of mechanical parts are attached to the body of the exposure apparatus and then the wires and pipes are connected; and overall adjustments (electrical adjustment and operation confirmation, etc.) are performed, thereby completing the manufacture of the exposure apparatus. It is desirable that the exposure apparatus is manufactured in a clean room in which, for example, the temperature, the degree of cleanliness and the like are managed.

Upon producing a microdevice (electronic device) such as a semiconductor device by using the exposure apparatus of the above-described embodiment, the semiconductor device is produced by performing, for example, a step of designing the function and the performance of the device; a step of manufacturing a reticle (mask) based on the designing step; a step of producing a substrate as a base material for the device, for example, a step for producing a wafer from a silicon material; a step of performing the alignment and the multi-exposure for patterns on the reticle(s) onto a wafer by using the exposure apparatus of the above-described embodiment; a step of forming a circuit pattern by processing the multi-exposed wafer (including a step for developing the multi-exposed wafer, a step of curing the developed wafer, an etching step, and the like); a step of assembling the device (including a dicing step, a bonding step, a packaging step, and the like); and an inspection step, etc.

The present invention is also applicable to exposure by using a liquid immersion exposure apparatus disclosed in, for example, International Publication Nos. 99/49504 and 2004/019128, etc. In this case, at the time of the scanning exposure, liquid such as pure or purified water is locally supplied between the projection optical system PL and the wafer W from an unillustrated liquid supply device, and the supplied liquid is recovered by an unillustrated liquid recovery device.

The present invention is also applicable to exposure by using a projection exposure apparatus which use, as the exposure light beam, an extreme ultraviolet light beam (EUV light beam) having a wavelength of about several nm to 100 nm.

Further, the present invention is not limited to the application to the exposure apparatus for producing a semiconductor device, and the present invention is also widely applicable, for example, to exposure apparatuses for a display device for a liquid crystal display or for a plasma display to be formed into a squared glass plate, and to exposure apparatuses for producing various devices such as image pickup devices (CCD and the like), micromachines, thin-film magnetic heads, micromachines, MEMS, and DNA chips, etc. Furthermore, the present invention is also applicable to an exposure step (exposure apparatus) for producing, by using the photolithography step, a mask (photomask, reticle, or the like) having a mask pattern for various devices formed therein.

It is as a matter of course that the present invention is not limited to the above-described embodiment, and the present invention may be constructed in various manners within the range not exceeding from the spirit of the present invention. The disclosure of the specification, claims, drawings and abstract of Japanese Patent Application No. 2006-058739 filed on Mar. 3, 2006 is incorporated herein by reference in their entirety.

The contents of the United States patents and United States patent application Publications mentioned in the specification of this application are incorporated herein by reference within a range of permission of the domestic laws and ordinances, even when the contents thereof are not specifically incorporated therein by reference.

According to the present invention, the double exposure can be performed in an optimal illumination condition with a high throughput, thereby making it possible to produce a device with a fine pattern with high accuracy and high throughput.

What is claimed is:

1. An exposure method in which an exposure light beam is irradiated onto a substrate via a mask and a projection optical system while moving the substrate in synchronization with movement of the mask in a predetermined scanning direction, the method comprising:
    a first step for moving a mask in the scanning direction, the mask having first and second pattern areas previously formed thereon to be adjacent in the scanning direction, and illuminating the first pattern area in a first illumination condition by using a first illumination area of which width in the scanning direction is variable, when the first pattern area passes across a field of the projection optical system, to expose the substrate;
    a second step for illuminating the first pattern area in the first illumination condition by using the first, illumination area of which width in the scanning direction is gradually narrowed and illuminating the second pattern area in a second illumination condition by using a second illumination area of which width in the scanning direction is gradually widened, when a part of the first pattern area and a part of the second pattern area simultaneously pass across the field, to expose the substrate simultaneously through the part of the first pattern area and the part of the second pattern area; and
    a third step for illuminating the second pattern area in the second illumination condition by using the second illumination area of which width in the scanning direction is variable, when the second pattern area passes across the field, to expose the substrate.

2. The exposure method according to claim 1, comprising a fourth step for step-moving the substrate, by a distance corresponding to the width of the second pattern area, in a direction corresponding to the scanning direction, and executing operations of the first to third steps to double-expose a block area, of the substrate, exposed with a pattern image of the second pattern area, with a pattern image of the first pattern area.

3. The exposure method according to claim 1, wherein the first and second illumination conditions are different from each other.

4. The exposure method according to claim 1, wherein areas, in which the widths in the scanning direction of the first and second illumination areas are maximized, are overlapped substantially completely.

5. The exposure method according to claim 1, wherein the first and second pattern areas are formed on different masks, respectively.

6. A method for producing a device, comprising:
    multi-exposing a sensitive object by using the exposure method as defined in claim 1; and
    developing the multi-exposed sensitive object.

7. An exposure method for exposing a substrate with an exposure light beam via a projection optical system, the method comprising:
    independently setting illumination conditions in first and second illumination areas onto which the exposure light beam is to be irradiated; and
    moving first and second patterns, which are arranged in a predetermined scanning direction, with respect to the first and second illumination areas while moving, in synchronization with the movement of the first and second patterns, the substrate with respect to a first exposure area onto which the exposure light beam is to be irradiated via the first pattern and the projection optical system and with respect to a second exposure area onto which the exposure light beam is to be irradiated via the second pattern and the projection optical system; and scanning-exposing different block areas, on the substrate, which are located at different positions in the scanning direction,
wherein before scanning-exposure of one block area of the different block areas is ended, scanning-exposure of the other block area of the different block areas is started; and
a width in the scanning direction of the first exposure area is gradually narrowed and a width in the scanning direction of the second exposure area is gradually widened while the scanning-exposure of the one block area and the scanning-exposure of the other block area are simultaneously performed.

8. The exposure method according to claim 7, wherein multiple exposure is performed for the different block areas respectively, the multiple exposure including exposure performed with one of the first and second patterns by the synchronous movements, and exposure performed with the other of the first and second patterns by synchronously moving the substrate and the other of the first and second patterns.

9. The exposure method according to claim 7, wherein the first and second exposure areas are arranged so that at least a part of the first exposure area and a part of the second exposure area are overlapped in the scanning direction.

10. The exposure method according to claim 7, wherein widths in the scanning direction of the first and second exposure areas are independently changed during the synchronous movements, and maximum widths in the scanning direction of the first and second exposure areas are greater than a spacing distance between the different block areas.

11. The exposure method according to claim 10, wherein widths in the scanning direction of the first and second illumination areas are made to be independently variable to change the widths in the scanning direction of the first and second exposure areas.

12. The exposure method according to claim 7, wherein widths in the scanning direction of the first and second exposure areas are independently variable, and the widths are changed so that the first and second exposure areas are not overlapped in the different block areas during the synchronous movements.

13. The exposure method according to claim 12, wherein widths in the scanning direction of the first and second illumination areas are made to be variable independently to change the widths in the scanning direction of the first and second exposure areas.

14. The exposure method according to claim 7, wherein the illumination condition in the first illumination area and the illumination condition in the second illumination area are mutually different during the synchronous movements.

15. The exposure method according to claim 7, wherein the first and second patterns are formed on a same mask.

16. The exposure method according to claim 7, wherein first and second exposure areas are arranged in a single field of the projection optical system.

17. The exposure method according to claim 7, wherein the first and second illumination areas are arranged in a single field of the projection optical system.

18. The exposure method according to claim 1, wherein the first and second illumination areas are illuminated by an exposure light beam from a same exposure light source.

19. The exposure method according to claim 1, wherein the first and second illumination areas are illuminated by exposure light beams from different exposure light sources respectively.

20. The exposure method according to claim 1, wherein during the exposure of the substrate, a liquid which transmits the exposure light beam therethrough is supplied between the projection optical system and the substrate.

21. A method for producing a device, comprising:
multi-exposing a sensitive object by using the exposure method as defined in claim 7; and
developing the multi-exposed sensitive object.

22. An exposure apparatus which moves a substrate synchronously with movement of a mask in a predetermined scanning direction while irradiating an exposure light beam onto the substrate via the mask and a projection optical system, the apparatus comprising:
an illumination optical system which illuminates a first illumination area, of which width in the scanning direction is variable in a field of the projection optical system, in a first illumination condition, and which illuminates a second illumination area, of which width in the scanning direction in the field is variable, in a second illumination condition; and
an illumination controller which controls the width in the scanning direction of the first illumination area and the width in the scanning direction of the second illumination area based on a position of the mask in the scanning direction,
wherein movement of a first pattern and a second pattern, formed on the mask, with respect to the first illumination area and the second illumination area is performed in synchronization with movement of the substrate with respect to a first exposure area onto which the exposure light beam is to be irradiated via the first pattern and the projection optical system and a second exposure area onto which the exposure light beam is to be irradiated via the second pattern and the projection optical system so that scanning-exposure of a first area on the substrate with the exposure light beam from the first illumination area is performed simultaneously with a part of scanning-exposure of a second area, different from the first area, on the substrate with the exposure light beam from the second illumination area, and
the width in the scanning direction of the first illumination area is gradually narrowed and the width in the scanning direction of the second illumination area is gradually widened while the scanning exposure of the first area and the scanning-exposure of the second area are simultaneously performed, and the gradual narrowing of the width in the scanning direction of the first illumination area occurs simultaneously with the gradual widening of the width in the scanning direction of the second illumination area.

23. The exposure apparatus according to claim 22, wherein the first pattern is formed on a first pattern area and the second pattern is formed on a second pattern area, and when the first and second pattern areas are formed on the mask to be adjacent to each other in the scanning direction, the illumination controller controls the widths in the scanning direction of the first and second illumination areas so that the first and second illumination areas illuminate only the first and second pattern areas respectively, in synchronization with the movement of the mask in the scanning direction.

24. The exposure apparatus according to claim 22, wherein the illumination optical system has:
a first partial illumination system which illuminates the first illumination area in the first illumination condition;
a second partial illumination system which illuminates the second illumination area in the second illumination condition; and a field coupling system which couples exposure light beams from the first and second partial illumination systems to illuminate the mask.

25. The exposure apparatus according to claim 24, wherein each of the first and second partial illumination systems has a variable field diaphragm; and the illumination controller controls opening and closing operations of the variable field diaphragm of each of the first and second partial illumination systems.

26. The exposure apparatus according to claim 24, further comprising:

an exposure light source; and a split optical system which splits an exposure light beam from the exposure light source into two split-light beams and guides the two split-light beams to the first and second partial illumination systems respectively.

27. The exposure apparatus according to claim 24, wherein each of the first and second partial illumination systems has an exposure light source.

28. The exposure apparatus according to claim 22, wherein the first and second illumination conditions are different from each other.

29. The exposure apparatus according to claim 22, wherein areas, in which the widths in the scanning direction of the first and second illumination areas are maximized, are overlapped substantially completely.

30. The exposure apparatus according to claim 22, comprising a liquid supply mechanism which supplies and recovers a liquid, through which the exposure light beam is transmitted, between the projection optical system and the substrate.

31. A method for producing a device, comprising:

multi-exposing a sensitive object by using the exposure apparatus as defined in claim 22; and developing the multi-exposed sensitive object.

32. An exposure apparatus which exposes a substrate with an exposure light beam via a projection optical system, comprising:

an illumination optical system which irradiates the exposure light beam onto first and second illumination areas and which sets illumination conditions in the first and second illumination areas independently from each other; and a controller which moves first and second patterns, arranged in a predetermined scanning direction, with respect to the first and second illumination areas while moving, in synchronization with the movement of the first and second patterns, the substrate with respect to a first exposure area onto which the exposure light beam is to be irradiated via the first pattern and the projection optical system and with respect to a second exposure area onto which the exposure light beam is to be irradiated via the second pattern and the projection optical system, and which scanning-exposes different block areas, on the substrate, located at different positions in the scanning direction, wherein before scanning-exposure of one block area of the different block areas is ended, scanning-exposure of the other block area of the different block areas is started, and a width in the scanning direction of the first exposure area is gradually narrowed and a width in the scanning direction of the second exposure area is gradually widened while the scanning-exposure of the one block area and the scanning-exposure of the other block area are simultaneously performed.

33. The exposure apparatus according to claim 32, wherein the controller performs multiple exposure in the different block areas respectively, the multiple exposure including exposure with one of the first and second patterns by the synchronous movements, and exposure with the other of the first and second patterns by synchronously moving the substrate and the other of the first and second patterns.

34. The exposure apparatus according to claim 32, wherein the first and second exposure areas are arranged so that at least a part of the first exposure area and a part of the second exposure area are overlapped in the scanning direction.

35. The exposure apparatus according to claim 32, wherein the controller makes illumination conditions in the first and second illumination areas to be different from each other at the time of the synchronous movements.

36. The exposure apparatus according to claim 32, further comprising an optical device which independently changes widths in the scanning direction of the first and second exposure areas;

wherein maximum widths of the first and second exposure areas, which are set with respect to the scanning direction during the synchronous movements, are wider than a spacing distance between the different block areas.

37. The exposure apparatus according to claim 36, wherein the optical device makes the widths in the scanning direction of the first and second illumination areas to be independently variable to change widths in the scanning direction of the first and second exposure areas.

38. The exposure apparatus according to claim 32, further comprising an optical device which changes widths in the scanning direction of the first and second exposure areas independently;

wherein the widths in the scanning direction of the first and second exposure areas are changed as not to be overlapped in the different block areas during the synchronous movements.

39. The exposure apparatus according to claim 38, wherein the optical device makes the widths in the scanning direction of the first and second illumination areas to be variable independently to change the widths in the scanning direction of the first and second exposure areas.

40. The exposure apparatus according to claim 32, wherein the illumination optical system includes first and second shaping optical systems into each of which the exposure light beam comes, and which make the illumination condition in the first illumination area and the illumination condition in the second illumination area to be variable.

41. The exposure apparatus according to claim 40, wherein the illumination optical system includes a coupling optical system which illuminates the first and second illumination areas with exposure light beams from the first and second shaping optical systems, respectively, at least one of the exposure light beams coming into one of the first and second illumination areas via a deflection member.

42. The exposure apparatus according to claim 40, further comprising optical devices which change widths in the scanning direction of the first and second exposure areas independently;

wherein the optical devices are provided on the first and second shaping optical systems respectively, and have first and second masking members which make widths in the scanning direction of the first and second illumination areas to be variable, respectively.

43. The exposure apparatus according to claim 32, wherein the controller drives a mask stage which holds a same mask on which the first and second patterns are formed and a substrate stage which holds the substrate to synchronously move the substrate and at least one of the first and second patterns.

44. The exposure apparatus according to claim 32, wherein the first and second exposure areas are arranged in a single field of the projection optical system.

45. The exposure apparatus according to claim 32, wherein the first and second illumination areas are arranged in a single field of the projection optical system.

46. A method for producing a device, comprising:

multi-exposing a sensitive object by using the exposure apparatus as defined in claim 32; and developing the multi-exposed sensitive object.

* * * * *